United States Patent
Lin et al.

(10) Patent No.: US 8,884,398 B2
(45) Date of Patent: Nov. 11, 2014

(54) ANTI-FUSE STRUCTURE AND PROGRAMMING METHOD THEREOF

(71) Applicant: United Microelectronics Corp., Hsin-Chu (TW)

(72) Inventors: Chu-Fu Lin, Kaohsiung (TW); Chien-Li Kuo, Hsinchu (TW); Ching-Li Yang, Ping-Tung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/854,142

(22) Filed: Apr. 1, 2013

(65) Prior Publication Data
US 2014/0291801 A1    Oct. 2, 2014

(51) Int. Cl.
*H01L 23/52*     (2006.01)
*H01L 23/525*    (2006.01)
*H01L 23/00*     (2006.01)

(52) U.S. Cl.
CPC ............ *H01L 23/5252* (2013.01); *H01L 24/11* (2013.01)
USPC ...... 257/530; 257/50; 257/E23.147; 438/131; 438/467

(58) Field of Classification Search
CPC ..................... H01L 23/5252; H01L 27/11206; H01L 27/1052; H01L 45/146
USPC ............ 257/50, 530, E23.147; 438/131, 467, 438/600
See application file for complete search history.

(56) References Cited

U.S. PATENT DOCUMENTS

| 3,150,299 | A | 9/1964 | Noyce |
| 3,256,465 | A | 6/1966 | Weissenstem |
| 3,323,198 | A | 6/1967 | Shortes |
| 3,343,256 | A | 9/1967 | Smith |
| 3,372,070 | A | 3/1968 | Zuk |
| 3,462,650 | A | 8/1969 | Hennings |
| 3,648,131 | A | 3/1972 | Stuby |
| 4,394,712 | A | 7/1983 | Anthony |
| 4,395,302 | A | 7/1983 | Courduvelis |
| 4,616,247 | A | 10/1986 | Chang |
| 4,773,972 | A | 9/1988 | Mikkor |
| 4,939,568 | A | 7/1990 | Kato |
| 5,214,000 | A | 5/1993 | Chazan |
| 5,229,647 | A | 7/1993 | Gnadinger |
| 5,286,926 | A | 2/1994 | Kimura |
| 5,372,969 | A | 12/1994 | Moslehi |

(Continued)

OTHER PUBLICATIONS

Sheu et al., Title: Semiconductor Package Structure and Interposer Therefor , pending U.S. Appl. No. 13/612,820, filed Sep. 12, 2012.

*Primary Examiner* — Cuong Q Nguyen
*Assistant Examiner* — Yosef Gebreyesus
(74) *Attorney, Agent, or Firm* — Winston Hsu; Scott Margo

(57) ABSTRACT

A method of programming an anti-fuse includes steps as follows. First, an insulating layer is provided. An anti-fuse region is defined on the insulating layer. An anti-fuse is embedded within the anti-fuse region of the insulating layer. The anti-fuse includes at least a first conductor and a second conductor. Then, part of the insulating layer is removed by a laser to form an anti-fuse opening in the insulating layer. Part of the first conductor and part of the second conductor are exposed through the anti-fuse opening. After that, a under bump metallurgy layer is formed in the anti-fuse opening to connect the first conductor and the second conductor electrically.

20 Claims, 5 Drawing Sheets

(56) References Cited

U.S. PATENT DOCUMENTS

| | | | | |
|---|---|---|---|---|
| 5,399,898 | A | 3/1995 | Rostoker | |
| 5,463,246 | A | 10/1995 | Matsunami | |
| 5,484,073 | A | 1/1996 | Erickson | |
| 5,502,333 | A | 3/1996 | Bertin | |
| 5,627,106 | A | 5/1997 | Hsu | |
| 5,652,169 | A * | 7/1997 | Jun | 438/600 |
| 5,793,115 | A | 8/1998 | Zavracky | |
| 5,936,297 | A * | 8/1999 | Jun | 257/530 |
| 5,977,640 | A | 11/1999 | Bertin | |
| 6,018,196 | A | 1/2000 | Noddin | |
| 6,031,275 | A * | 2/2000 | Kalnitsky et al. | 257/530 |
| 6,143,616 | A | 11/2000 | Geusic | |
| 6,274,937 | B1 | 8/2001 | Ahn | |
| 6,309,956 | B1 | 10/2001 | Chiang | |
| 6,391,777 | B1 | 5/2002 | Chen | |
| 6,407,002 | B1 | 6/2002 | Lin | |
| 6,440,640 | B1 | 8/2002 | Yang | |
| 6,483,147 | B1 | 11/2002 | Lin | |
| 6,525,419 | B1 | 2/2003 | Deeter | |
| 6,548,891 | B2 | 4/2003 | Mashino | |
| 6,551,857 | B2 | 4/2003 | Leedy | |
| 6,627,985 | B2 | 9/2003 | Huppenthal | |
| 6,633,083 | B2 | 10/2003 | Woo | |
| 6,746,936 | B1 | 6/2004 | Lee | |
| 6,778,275 | B2 | 8/2004 | Bowes | |
| 6,800,930 | B2 | 10/2004 | Jackson | |
| 6,812,193 | B2 | 11/2004 | Estes | |
| 6,831,013 | B2 | 12/2004 | Tsai | |
| 6,897,148 | B2 | 5/2005 | Halahan | |
| 6,924,551 | B2 | 8/2005 | Rumer | |
| 6,930,048 | B1 | 8/2005 | Li | |
| 7,034,401 | B2 | 4/2006 | Savastiouk | |
| 7,052,937 | B2 | 5/2006 | Clevenger | |
| 7,075,133 | B1 | 7/2006 | Padmanabhan | |
| 7,098,070 | B2 | 8/2006 | Chen | |
| 7,111,149 | B2 | 9/2006 | Eilert | |
| 7,115,493 | B2 * | 10/2006 | Forbes et al. | 438/600 |
| 7,166,913 | B2 | 1/2007 | Chinthakindi | |
| 7,222,420 | B2 | 5/2007 | Moriizumi | |
| 7,282,951 | B2 | 10/2007 | Huppenthal | |
| 7,323,785 | B2 | 1/2008 | Uchiyama | |
| 7,338,896 | B2 | 3/2008 | Vanhaelemeersch | |
| 7,402,515 | B2 | 7/2008 | Arana | |
| 7,432,592 | B2 | 10/2008 | Shi | |
| 7,531,415 | B2 | 5/2009 | Kwok | |
| 7,541,677 | B2 | 6/2009 | Kawano | |
| 7,564,115 | B2 | 7/2009 | Chen | |
| 7,598,607 | B2 | 10/2009 | Chung | |
| 7,633,165 | B2 | 12/2009 | Hsu | |
| 7,732,926 | B2 | 6/2010 | Uchiyama | |
| 7,795,735 | B2 | 9/2010 | Hsu | |
| 7,812,426 | B2 | 10/2010 | Peng | |
| 7,816,227 | B2 | 10/2010 | Chen | |
| 7,825,024 | B2 | 11/2010 | Lin | |
| 7,825,517 | B2 | 11/2010 | Su | |
| 7,843,064 | B2 | 11/2010 | Kuo | |
| 7,846,837 | B2 | 12/2010 | Kuo | |
| 7,851,346 | B2 | 12/2010 | Lee | |
| 7,928,534 | B2 | 4/2011 | Hsu | |
| 7,932,608 | B2 | 4/2011 | Tseng | |
| 7,939,941 | B2 | 5/2011 | Chiou | |
| 7,955,895 | B2 | 6/2011 | Yang | |
| 7,956,442 | B2 | 6/2011 | Hsu | |
| 7,969,013 | B2 | 6/2011 | Chen | |
| 8,026,592 | B2 | 9/2011 | Yoon | |
| 8,034,708 | B2 | 10/2011 | Kuo | |
| 8,049,327 | B2 | 11/2011 | Kuo | |
| 8,053,898 | B2 | 11/2011 | Marcoux | |
| 8,053,900 | B2 | 11/2011 | Yu | |
| 8,053,902 | B2 | 11/2011 | Chen | |
| 8,063,496 | B2 | 11/2011 | Cheon | |
| 8,736,020 | B2 * | 5/2014 | Bao et al. | 257/530 |
| 2001/0038972 | A1 | 11/2001 | Lyons | |
| 2002/0182837 | A1 * | 12/2002 | Daubenspeck et al. | 438/601 |
| 2004/0080041 | A1 | 4/2004 | Kimura | |
| 2004/0188817 | A1 | 9/2004 | Hua | |
| 2005/0112997 | A1 | 5/2005 | Lin | |
| 2005/0136635 | A1 | 6/2005 | Savastiouk | |
| 2005/0205991 | A1 | 9/2005 | Chen | |
| 2006/0035146 | A1 | 2/2006 | Hayashi | |
| 2006/0042834 | A1 | 3/2006 | Lee | |
| 2006/0102982 | A1 * | 5/2006 | Park et al. | 257/528 |
| 2007/0117348 | A1 | 5/2007 | Ramanathan | |
| 2007/0126085 | A1 | 6/2007 | Kawano | |
| 2007/0190692 | A1 | 8/2007 | Erturk | |
| 2008/0073747 | A1 | 3/2008 | Chao | |
| 2008/0108193 | A1 | 5/2008 | You | |
| 2008/0157271 | A1 * | 7/2008 | Suzuki | 257/530 |
| 2008/0217658 | A1 * | 9/2008 | Kim et al. | 257/209 |
| 2009/0127667 | A1 | 5/2009 | Iwata | |
| 2009/0134498 | A1 | 5/2009 | Ikeda | |
| 2009/0180257 | A1 | 7/2009 | Park | |
| 2009/0224405 | A1 | 9/2009 | Chiou | |
| 2010/0001379 | A1 | 1/2010 | Lee | |
| 2010/0140749 | A1 | 6/2010 | Kuo | |
| 2010/0140772 | A1 | 6/2010 | Lin | |
| 2010/0148915 | A1 * | 6/2010 | Kuo et al. | 337/290 |
| 2010/0244247 | A1 | 9/2010 | Chang | |
| 2010/0323478 | A1 | 12/2010 | Kuo | |
| 2012/0032256 | A1 * | 2/2012 | Takaishi et al. | 257/330 |

\* cited by examiner

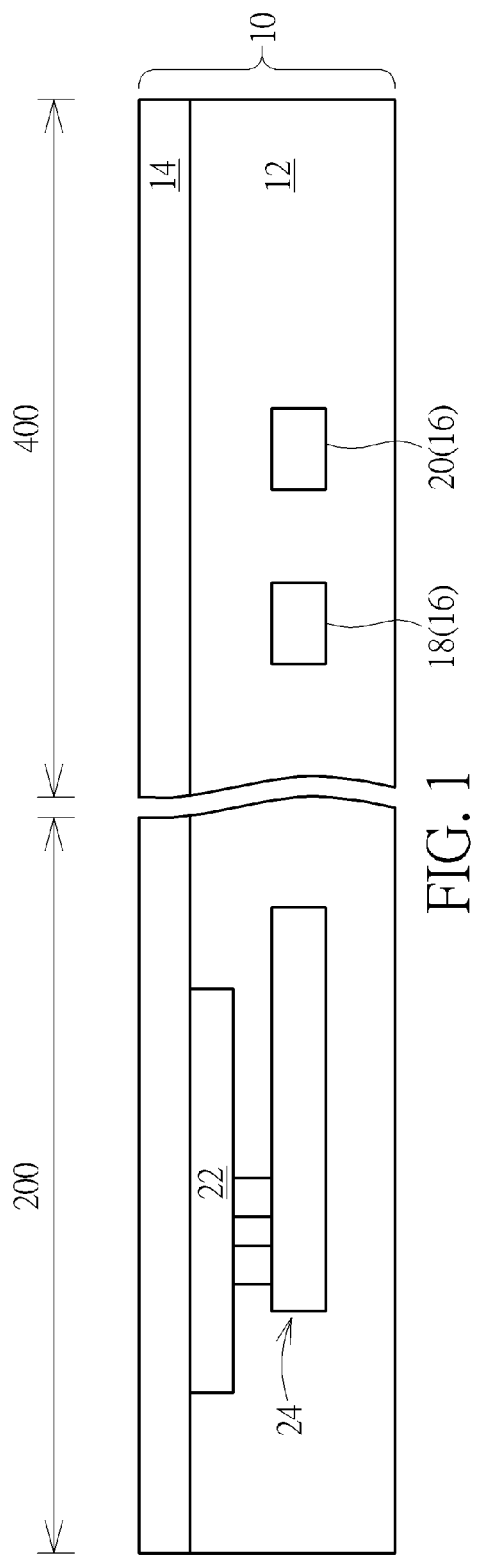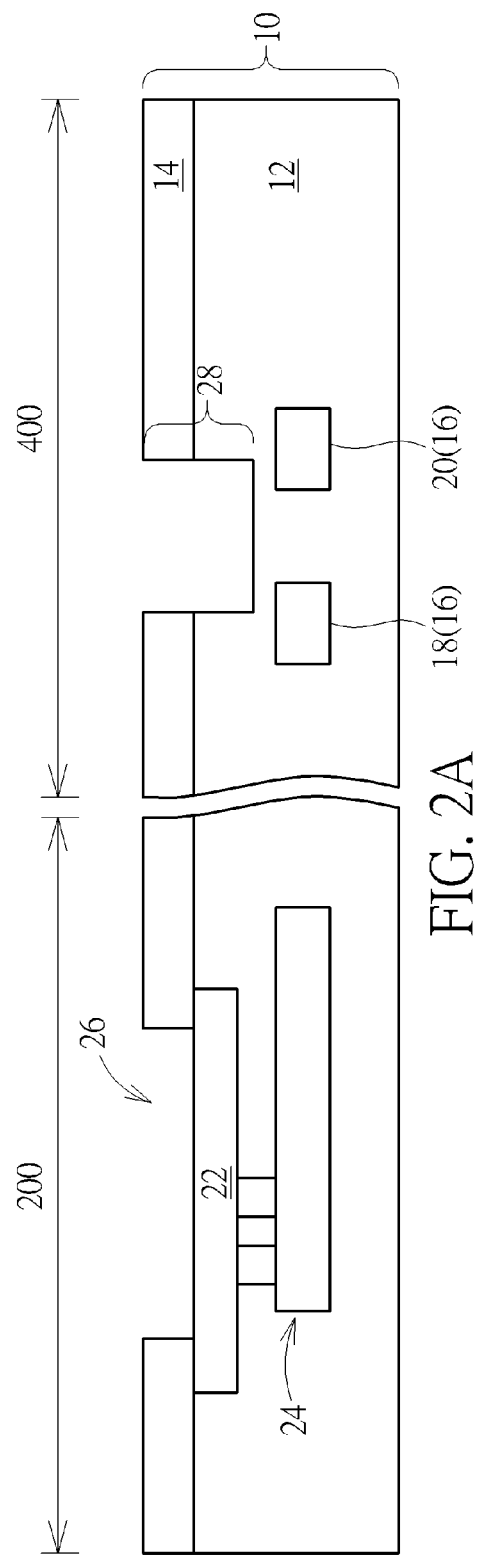

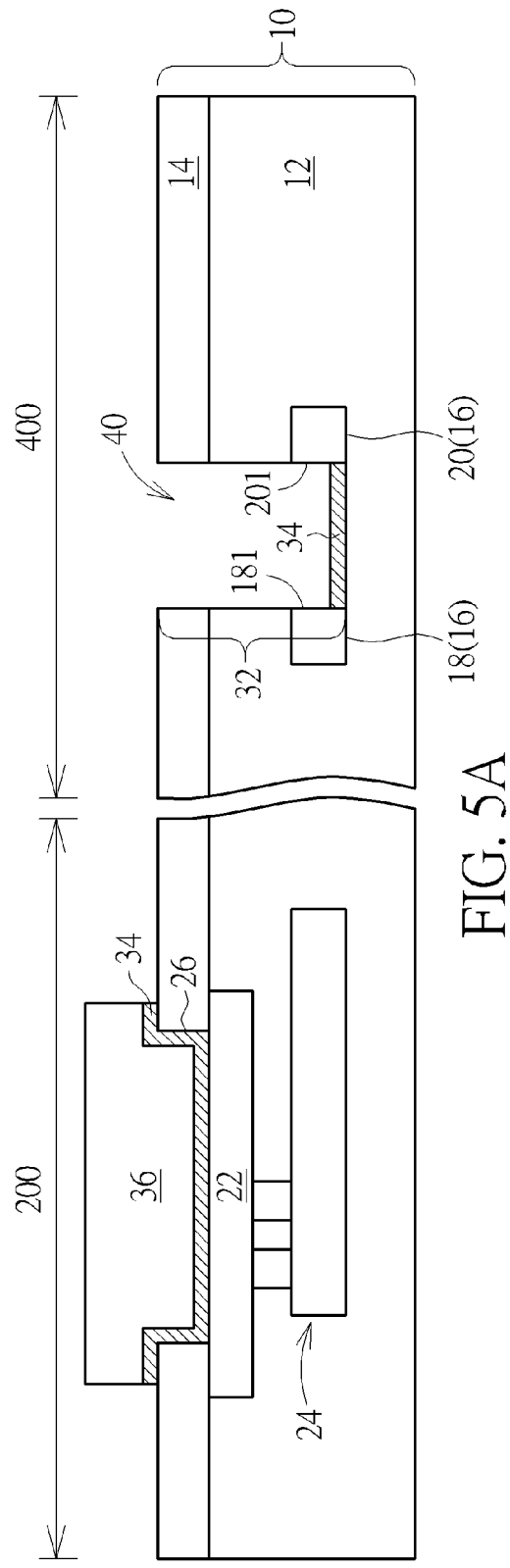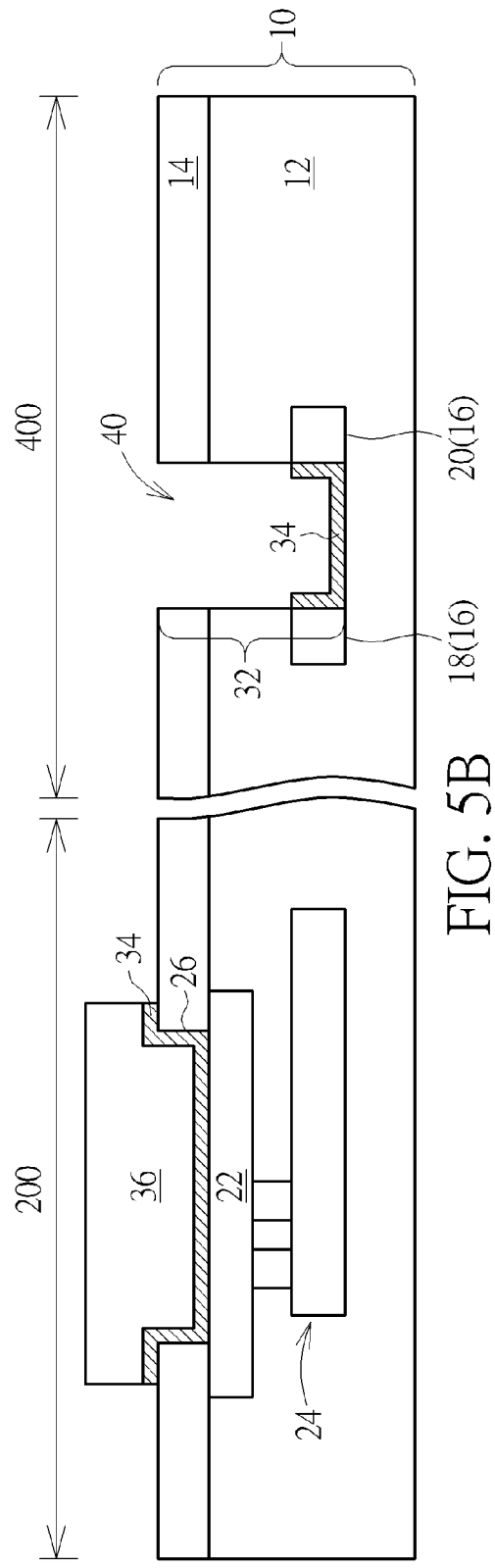

ANTI-FUSE STRUCTURE AND PROGRAMMING METHOD THEREOF

BACKGROUND OF THE INVENTION

1. Field of the Invention

The present invention relates to an anti-fuse structure and a programming method thereof, and more particularly to a method of programming an anti-fuse using a laser, and electrically connecting the anti-fuse with an under bump metallurgy layer. The present invention also relates to an anti-fuse structure formed by the aforesaid method.

2. Description of the Prior Art

A fuse and an anti-fuse are electrical devices that perform opposite functions. A fuse starts with a low resistance and is designed to permanently break an electrically conductive path, whereas an anti-fuse starts with a high resistance and is designed to permanently create an electrically conductive path.

This technology is widely used in integrated circuits. For example, the fuse or the anti-fuse is often used to repair circuits or to function as a programmable link. When defects are found in a circuit, fuses can be selectively cut or anti-fuses can be selectively conducted for repairing or replacing defective circuits. Alternatively, after a semiconductor wafer is completed, data input can be performed from outside by using the fuse or anti-fuse as a programmable link. Data bits "1" or "0" can be decided by electrically conducting or cutting the fuse or the anti-fuse.

As fuses and anti-fuses are commonly used in semiconductor elements such as DRAMs, SRAMs, PROMs or FPGAs, integrating the fabricating steps of the fuse and anti-fuse with other semiconductor elements is a primary objective in the field.

SUMMARY OF THE INVENTION

According to one exemplary embodiment of the present invention, an anti-fuse programming method includes the following steps. An insulating layer having an anti-fuse region is provided. An anti-fuse at least comprising a first conductor and a second conductor is embedded within the anti-fuse region. Subsequently, the insulating layer is etched by a laser to form an anti-fuse opening in the insulating layer. The first conductor and the second conductor are exposed partly through the anti-fuse opening. Finally, an under bump metallurgy layer is formed in the anti-fuse opening to electrically connect the exposed first conductor and the exposed second conductor.

According to another exemplary embodiment of the present invention, another anti-fuse programming method includes the following steps. First, an insulating layer having an anti-fuse region and a circuit region is provided, wherein the circuit region is separated from the anti-fuse region. An anti-fuse at least comprising a first conductor and a second conductor is embedded within the anti-fuse region and a pad electrically connecting to a set of interconnects is embedded in the insulating layer within the circuit region. Then, the insulating layer partly within the circuit region and within the anti-fuse region partly is removed by a lithographic process to form a conductive pad opening exposing the pad and a lithographic opening above the anti-fuse. The insulating layer below the lithographic opening is then etched by a laser to form a laser opening extending from the lithographic opening and partly exposing the first conductor and the second conductor through the laser opening, wherein the lithographic opening and the laser opening forms an anti-fuse opening. Finally, an under bump metallurgy layer disposed in the anti-fuse opening and the conductive pad opening is formed, wherein the under bump metallurgy layer in the anti-fuse opening electrically connects the exposed first conductor and the exposed second conductor.

According to another exemplary embodiment of the present invention, an anti-fuse structure is provided. The anti-fuse structure includes an anti-fuse, an anti-fuse opening and an under bump metallurgy layer. The anti-fuse comprises at least a first conductor and a second conductor disposed within an insulating layer. An anti-fuse opening is disposed between the first conductor and the second conductor. A first edge of the first conductor and a second edge of the second conductor are exposed through the anti-fuse opening. The under bump metallurgy layer is disposed in the anti-fuse opening to electrically connect the first edge of the first conductor and the second edge of the second conductor, wherein the first conductor and the second conductor only electrically connect to each other through the under bump metallurgy layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating an anti-fuse programming method according to a preferred exemplary embodiment of the present invention.

FIG. 2A and FIG. 2B are schematic diagrams illustrating lithographic processes according to different embodiments.

FIG. 5A to FIG. 5D are schematic diagrams illustrating anti-fuse structures according to different embodiments.

DETAILED DESCRIPTION

Figure 2B:
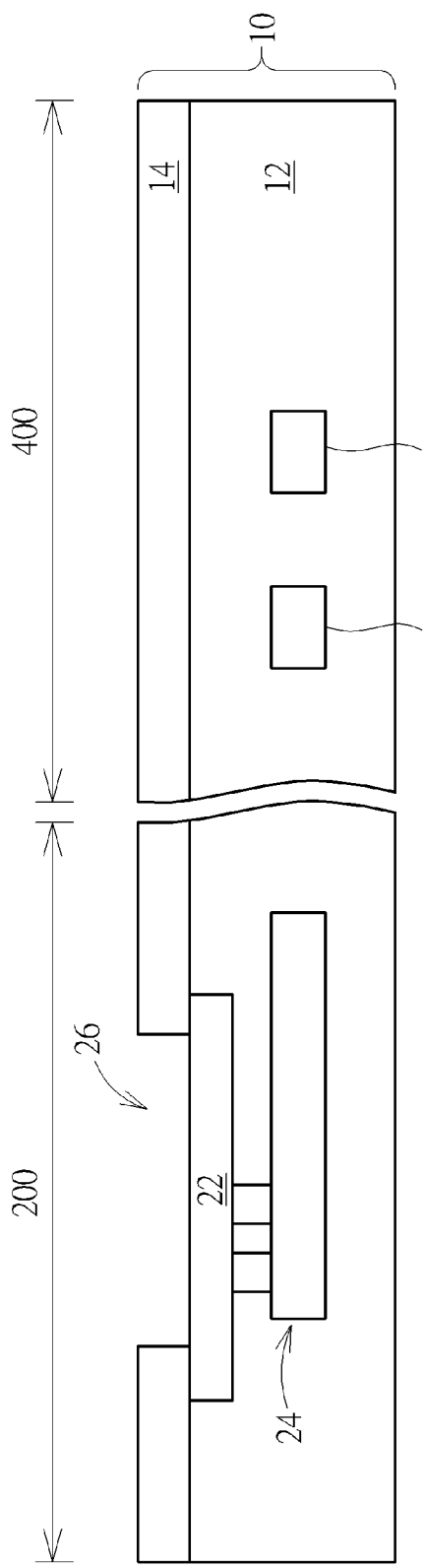

In the following description, numerous specific details are given to provide a thorough understanding of the invention. In order to focus on the specific inventive features of the present invention, some well-known system configurations and process steps are not disclosed in detail.

Likewise, the drawings showing embodiments of the apparatus are semi-diagrammatic and not to scale: in particular, some of the dimensions are for clarity of presentation and are exaggerated in the figures. Also, where multiple embodiments are disclosed and described which have some features in common, for ease of illustration, like or similar features will ordinarily be described with the same reference numerals.

Figure 3A:
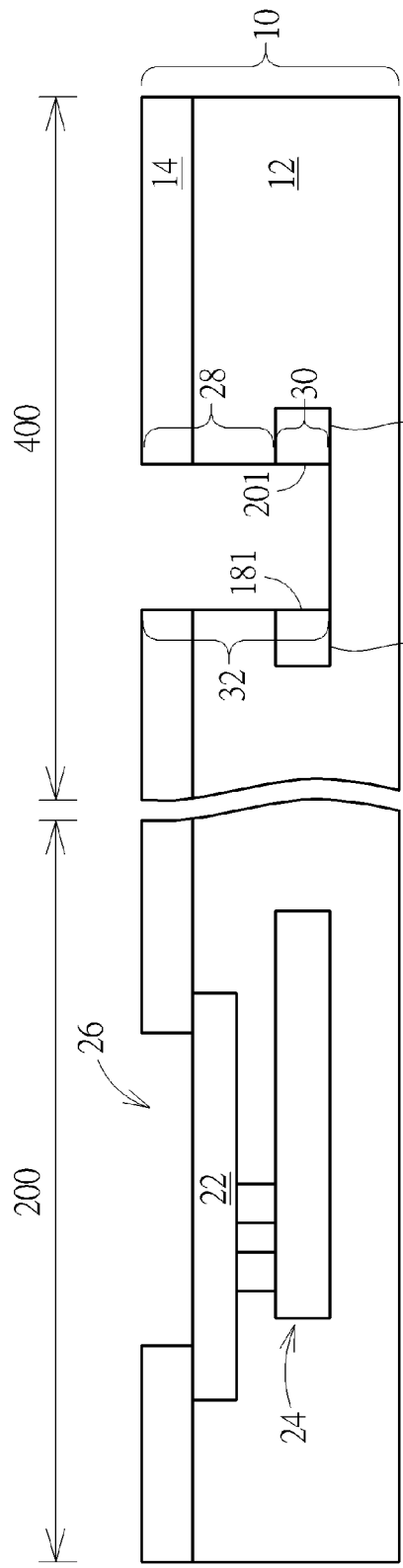
FIG. 3A and FIG. 3B are schematic diagrams illustrating anti-fuse openings according to different embodiments.
Figure 3B:
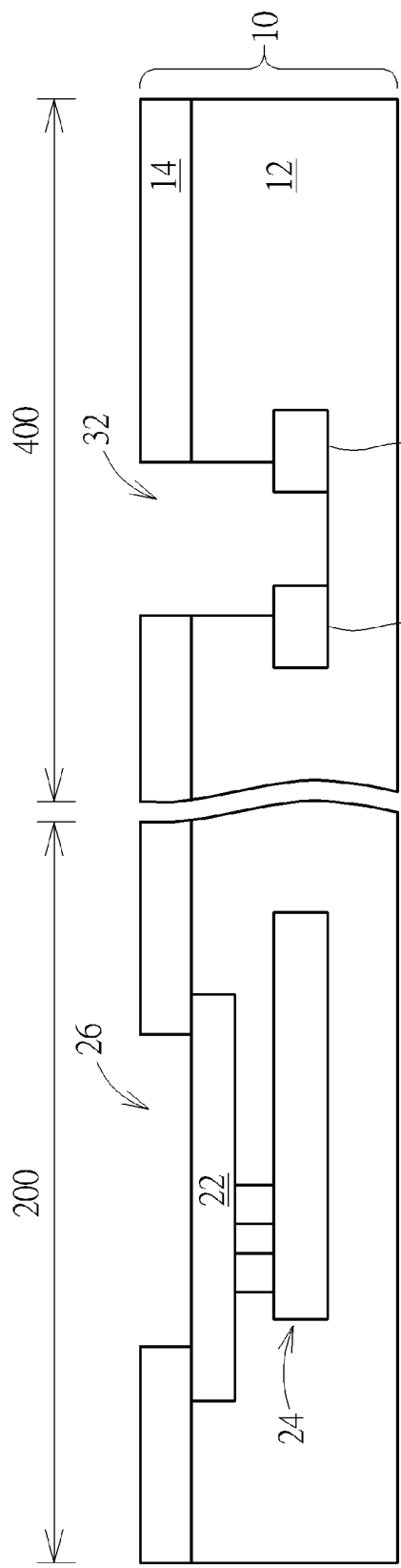
Figure 4:
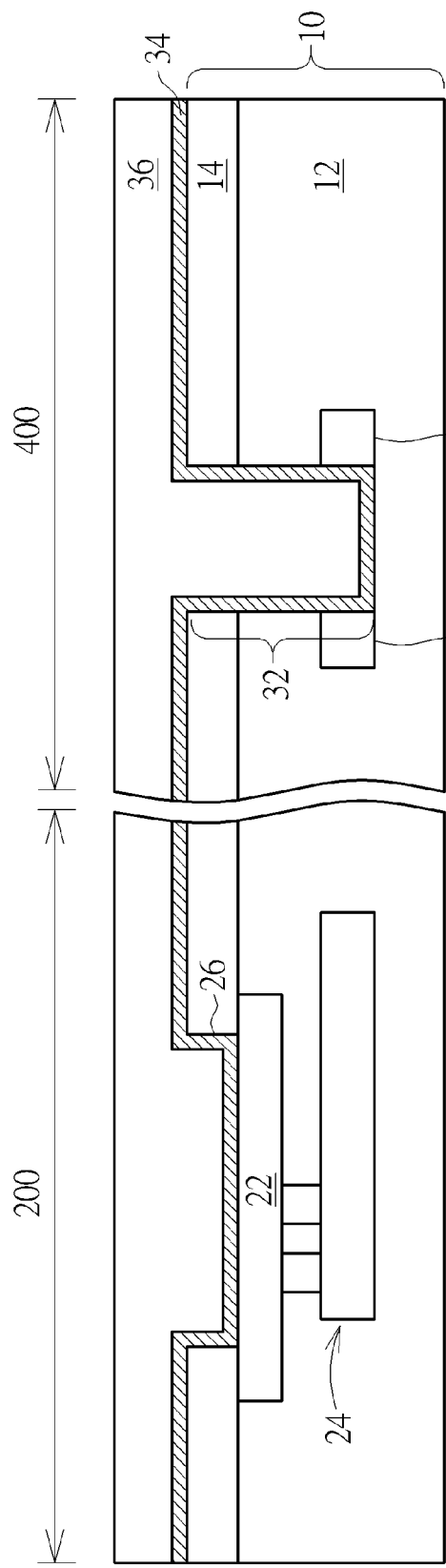

The preferred exemplary embodiments of the present invention are illustrated in the accompanying drawings with numbered elements as follows. FIG. 1 to FIG. 5 are schematic diagrams illustrating an anti-fuse programming method according to a preferred exemplary embodiment of the present invention. FIG. 2A and FIG. 2B are schematic diagrams illustrating lithographic processes according to different embodiments. FIG. 3A and FIG. 3B are schematic diagrams illustrating anti-fuse openings according to different embodiments. FIG. 5A, FIG. 5B, FIG. 5C and FIG. 5D are schematic diagrams illustrating anti-fuse structures according to different embodiments.

Please refer to FIG. 1. A substrate (not shown) is provided. The substrate may be a semiconductor substrate composed of silicon, gallium arsenide (GaAs), silicon on insulator (SOI)

layer, epitaxial layer, SiGe layer or other semiconductor materials. At least one active element such as a MOS transistor is formed on the substrate. An insulating layer 10 is disposed on the substrate. At least two regions such as a circuit region 200 and an anti-fuse region 400 are defined on the insulating layer 10. The insulating layer 10 may consist of single material layer or multiple material layers. For instance, the insulating layer 10 can be formed by silicon oxide, silicon nitride or other insulating materials. According to a preferred embodiment of the present invention, the insulating layer includes a silicon nitride layer 12 as a bottom and a silicon oxide layer 14 as a top, but the invention is not limited herein. At least one anti-fuse 16 is embedded within the anti-fuse region 400 in the insulating layer 10. The anti-fuse 16 comprises at least two conductors such as a first conductor 18 and a second conductor 20 which are isolated from each other. The first conductor 18 and the second conductor 20 are both preferably rectangular metal stripes, and they are arranged parallel to each other by their longest edges, but the structure is not limited herein. The first conductor 18 and the second conductor 20 may have different shapes and arrangements based on different product requirements. Furthermore, the first conductor 18 and the second conductor 20 may individually comprise copper or other conductive materials, and the materials of the first conductor 18 and the second conductor 20 can be the same or different. A conductive pad 22 is embedded within the circuit region 200 in the insulating layer 10. The conductive pad 22 electrically connects to at least a set of interlayer connection 24. The conductive pad 22 preferably includes aluminum. It is noteworthy that the anti-fuse 16 is formed by taking advantage of the process of forming the interlayer connection 24. The anti-fuse 16 is fabricated simultaneously with the interlayer connection 24. More particularly, the fabricating steps of the anti-fuse 16 and the interlayer connection 24 include forming numerous trenches within the insulating layer 10 by a lithographic process. Then, all the trenches are filled up with a conductive material. The trenches filled with the conductive material within the anti-fuse region 400 become the anti-fuse 16. The trenches filled with the conductive material within the circuit region 200 become the interlayer connection 24. The conductive pad 22 is then formed above the interlayer connection 24. In other words, the anti-fuse 16 is completed before the conductive pad 22.

As shown in FIG. 2A, according to a first preferred embodiment of the present invention, a lithographic process is performed to form a first lithographic opening 26 above the conductive pad 22 within the circuit region 200 and form a second lithographic opening 28 above the anti-fuse 16. The first lithographic opening 26 serves as a conductive pad opening 26, as detailed in the following steps. After the lithographic process, the conductive pad 22 is exposed. This lithographic process in the traditional process is only for forming the conductive pad opening 26 to expose the conductive pad 22, which allows the exposed conductive pad 22 to connect to a bonding ball or other wires afterwards. The present invention, however, utilizes the lithographic process to form the second lithographic opening 28 as well. It must be stressed that the second lithographic opening 28 is directly above the anti-fuse 16, but the anti-fuse 16 is not exposed and is still buried within the insulating layer 10. The second lithographic opening 28 can increase the efficiency of programming the anti-fuse afterwards.

Please refer to FIG. 2B. According to a second preferred embodiment of the present invention, during the aforesaid lithographic process, only the first lithographic opening 26 within the circuit region 200 is formed. The opening within the anti-fuse region 400 is not formed. That is, in the second embodiment, only the conductive pad opening 26 within the circuit region 200 is formed.

In FIG. 3A, in continuous of FIG. 2A, when the first embodiment is completed, a laser process is performed by utilizing the laser to remove the insulating layer 10 at the bottom of the second lithographic opening 28. The first conductor 18 and the second conductor 20 are also removed partly by the laser. At this point, a laser opening 30 is formed. The laser can even remove the insulating layer 10 at the bottom of the second lithographic opening 28 so that the bottom of the laser opening 30 is lower than the entire antfuse 16. Edges 181/201 of the first conductor 18 and the second conductor 20 respectively define part of the sidewall of the laser opening 30. In other words, the edges 181/201 are exposed through the laser opening 30. Now, the second lithographic opening 28 and the laser opening 30 together form an anti-fuse opening 32. In this embodiment, the cross-section of the anti-fuse opening 32 is preferably rectangular.

In FIG. 3A, in continuous of FIG. 2B, in a situation where only the conductive pad opening 26 is formed, during the laser process, the formation of the laser opening 32 is entirely dependent on the laser process. In other words, the laser is used to remove the insulating layer 10 directly above the anti-fuse 16 and form the laser opening 32 to expose edges 181/201 of the first conductor 18 and the second conductor 20 respectively. Likewise, the laser also removes part of the first conductor 18 and the second conductor 20. In this embodiment, the laser opening 32 serves as an anti-fuse opening 32. The cross-section of the anti-fuse opening 32 is preferably rectangular.

As shown in FIG. 3A, according to the third preferred embodiment of the present invention, the anti-fuse opening 32 and the conductive pad opening 26 are both formed by the lithographic process. More specifically, the lithographic process is used to etch the insulating layer 10 within the circuit region 200 and the anti-fuse region 400 so as to form a first lithographic opening 26 and a third lithographic opening 32. The third lithographic opening serves as an anti-fuse opening 32 and the first lithographic opening 26 serves as a conductive pad opening 26 in the following steps. The difference between the first preferred embodiment and the third preferred embodiment is that the third lithographic opening 32 of the third preferred embodiment is deeper than the second lithographic opening 28 of the first preferred embodiment. In other words, the lithographic process in the third embodiment not only etches the insulating layer 10 within the anti-fuse region 400, but also partly etches the first conductor 18 and the second conductor 20. Therefore, after the lithographic process, edges 181/201 of the first conductor 18 and the second conductor 20 can be exposed through the anti-fuse opening 32. The cross-section of the anti-fuse opening 32 is preferably rectangular.

FIG. 3B illustrates a varied type of FIG. 3A. The difference between FIG. 3A and FIG. 3B is that, in the embodiment of FIG. 3B, only the insulating layer 10 is etched no matter whether the lithographic process or the laser process is applied. Taking the laser process as an example, the parameters of the laser are adjusted to control the laser to only etch the insulating layer 10 rather than the first conductor 18 and the second conductor 20. More precisely, the laser only removes the insulating layer 10 contacting the first conductor 18 and the second conductor 20 without damaging the first conductor 18 and the second conductor 20. Similar to the lithographic process, the etchant used in the lithographic process only etches the insulating layer 10. The etchant only removes the insulating layer 10 contacting the first conductor 18 and the second conductor 20 without damaging the first conductor 18 and the second conductor 20. In the end, the cross-section of the anti-fuse opening 32 will become a reversed bottle shape.

The following fabricating steps are described by taking the cross-section of the anti-fuse opening 32 being rectangular as an example. Please note, however, that the following description also applies to the reversed bottle cross-section. Please refer to FIG. 4, which illustrates an under bump metallurgy layer 34 formed blankly which conformally covers the surface of the insulating layer 10, the conductive pad opening 26 and the anti-fuse opening 32. The conductive pad opening 26 and the anti-fuse opening 32 are not filled up by the under bump metallurgy layer. The under bump metallurgy layer 34 may be formed of multiple material layers comprising titanium, copper, tungsten or other conductive materials. Next, a conductive layer 36 is formed to cover the surface of the under bump metallurgy layer 34 and fill up the conductive pad opening 26 and the anti-fuse opening 32. The conductive layer 36 may be titanium, copper, tungsten or other conductive materials.

As shown in FIG. 5A, the conductive layer 36 and the under bump metallurgy layer 34 are patterned to remove the conductive layer 36 and part of the under bump metallurgy layer 34 in the anti-fuse opening 32 and partly remove the conductive layer 36 and the under bump metallurgy layer 34 on the top surface of the insulating layer 10. After the patterning process, the under bump metallurgy layer 34 disposed at the bottom of the anti-fuse opening 32 will remain, and the under bump metallurgy layer 34 and the conductive layer 36 disposed in the conductive pad opening 26 remain as well. The under bump metallurgy layer 34 disposed at the bottom of the anti-fuse opening 32 forms a straight-lined cross-section and the under bump metallurgy layer 34 electrically connects the edge 181 of the first conductor 18 to the edge 201 of the second conductor 20. Therefore, the anti-fuse 16 is conducted electrically through the under bump metallurgy layer 34. The conductive layer 36 in the conductive pad opening 26 can be a bonding ball, wires in a redistribution layer, passive components or other elements. The under bump metallurgy layer 34 in the conductive pad opening 26 serves as a buffering layer. At this point, an anti-fuse structure 40 of the present invention is completed. It is important to note that, in this embodiment, the anti-fuse 16 is only conducted electrically through the under bump metallurgy layer 34. That is, besides the under bump metallurgy layer 34 in the anti-fuse opening 32, there is no other conductive material in the anti-fuse opening 32.

Please refer to FIG. 5B which shows another preferred embodiment of the anti-fuse structure 40 of the present invention. The difference between FIG. 5A and FIG. 5B is that the under bump metallurgy layer 34 in the anti-fuse opening 32 forms a U shape. In other words, the under bump metallurgy layer 34 is not only disposed at the bottom of the anti-fuse opening 32, but also at the sidewall of the anti-fuse opening 32.

Figure 5C:
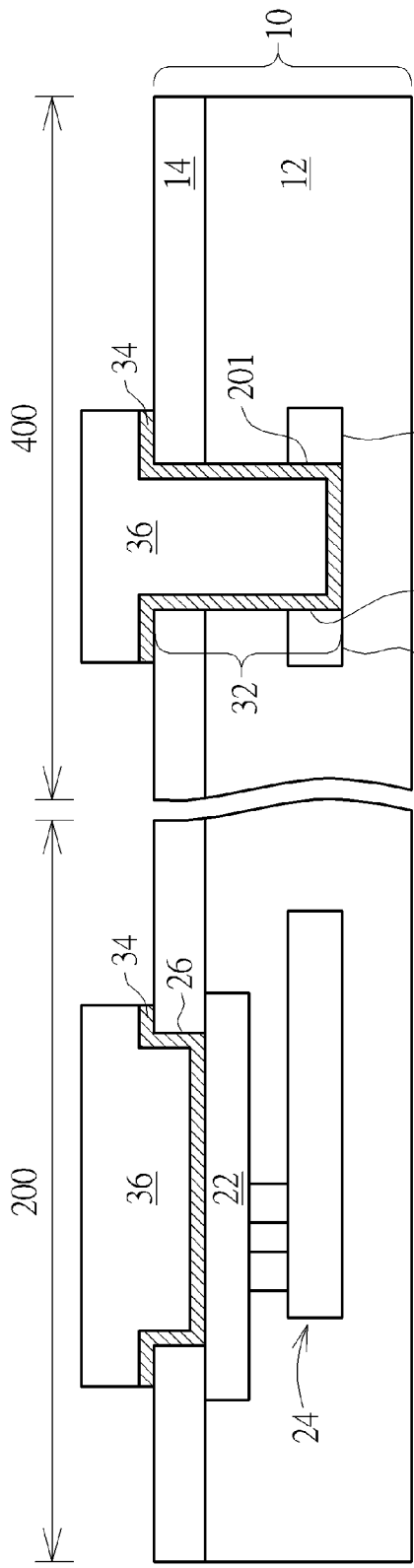

Moreover, please refer to FIG. 5C which shows yet other preferred embodiment of the anti-fuse structure 40. The difference between FIG. 5A and FIG. 5C is that the under bump metallurgy layer 34 and the conductive layer 36 both remain in the anti-fuse opening 32. In other words, the anti-fuse 16 is conducted electrically by the under bump metallurgy layer 34 and the conductive layer 36.

After programming the anti-fuse by the programming method of the present invention, the following anti-fuse structures are formed and introduced as follows.

Please refer to FIG. 5A. According to an embodiment of the present invention, an anti-fuse structure 40 includes an anti-fuse 16, an insulating layer 10, an anti-fuse opening 32 and a under bump metallurgy layer 34. The insulating layer 10 may consist of a single material layer or multiple material layers. For instance, the insulating layer 10 can be formed by silicon oxide, silicon nitride or other insulating materials. According to a preferred embodiment of the present invention, the insulating layer includes a silicon nitride layer 12 as a bottom and a silicon oxide layer 14 as a top, but the invention is not limited herein. The anti-fuse 16 disposed in the insulating layer 10 comprises at least two conductors such as a first conductor 18 and a second conductor 20. The aforesaid anti-fuse opening 32 is disposed between the first conductor 18 and the second conductor 20. The first conductor 18 and the second conductor 20 are both preferably rectangular metal stripes, and they are arranged parallel to each other by their longest edges, but the structure is not limited herein. The first conductor 18 and the second conductor 20 may have different shapes and arrangements based on different product requirements. Furthermore, the first conductor 18 and the second conductor 20 may individually comprise copper or other conductive materials, and the materials of the first conductor 18 and the second conductor 20 can be the same or different. Furthermore, the first conductor 18 and the second conductor 20 are both embedded in the insulating layer 10 and the edges 181/201 of the first conductor 18 and second conductor 20 are exposed. Moreover, the under bump metallurgy layer 34 is disposed at the bottom of the anti-fuse opening 32 for electrically connecting the first conductor 18 to the second conductor 20. The cross-section of the anti-fuse opening 32 is preferably a straight line, and the cross-section of the anti-fuse opening 32 is preferably rectangular. It is noteworthy that the anti-fuse 16 is only conducted electrically through the under bump metallurgy layer 34. That is, besides the under bump metallurgy layer 34 in the anti-fuse opening 32, there is no other conductive material in the anti-fuse opening 32.

Please refer to FIG. 5B. According to another embodiment of the present invention, another anti-fuse structure 40 is provided, wherein elements which are substantially the same as those in the embodiment of FIG. 5A are denoted by the same reference numerals; an accompanying explanation is therefore omitted. The difference between FIGS. 5B and 5A is that the under bump metallurgy layer 34 in the anti-fuse opening 32 forms a U shape. The anti-fuse 16 is only conducted electrically through the under bump metallurgy layer 34.

Please refer to FIG. 5C. According to another embodiment of the present invention, yet another anti-fuse structure 40 is provided. The difference between FIGS. 5C and 5A is that the under bump metallurgy layer 34 conformally covers the bottom and the sidewall of the anti-fuse opening 32, and extends to the top surface of the insulating layer 10. Therefore, the edges 181/201 are not exposed. In addition, a conductive layer 36 fills in the anti-fuse opening 36 and covers the under bump metallurgy layer 34. More specifically, the under bump metallurgy layer 34 and the conductive layer 36 together fill up the anti-fuse opening 32.

Figure 5D:
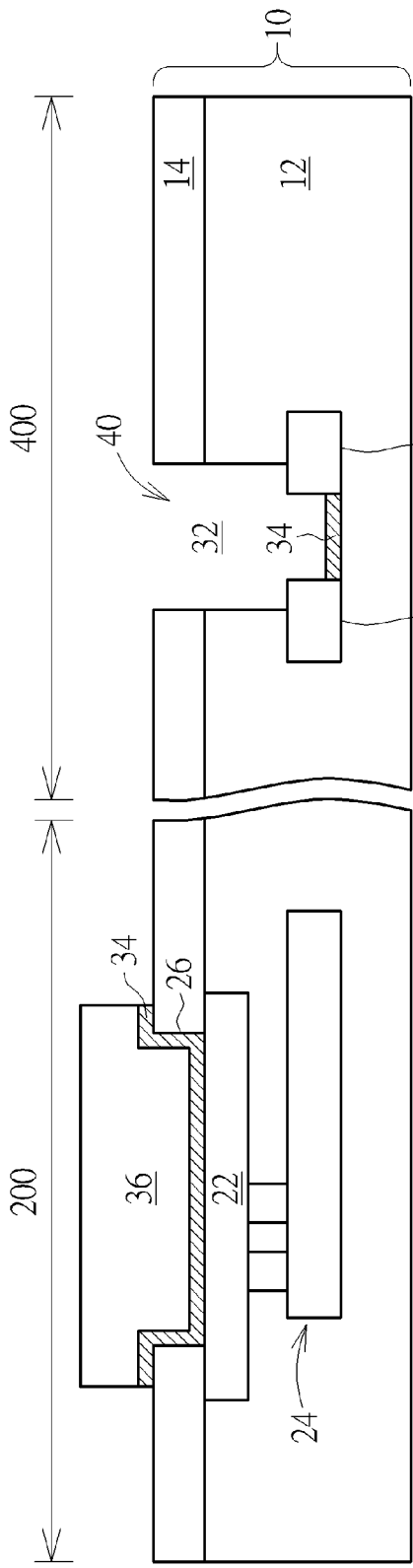

Please refer to FIG. 5D, which illustrates an anti-fuse structure 40 according to another embodiment of the present invention, wherein elements which are substantially the same as those in the embodiment of FIG. 5A are denoted by the same reference numerals; an accompanying explanation is therefore omitted. The difference between FIGS. 5D and 5A is that the anti-fuse opening 32 in FIG. 5D has a reversed bottle cross-section.

The method of programming an anti-fuse provided in the present invention has the following advantages. In the first preferred embodiment of the present invention, the second lithographic opening 28 is etched via the etching step for etching the conductive pad opening 26. That is, the second lithographic opening 28 and the conductive pad opening 26 are formed simultaneously. Based on the test results of the chip, it is determined whether or not to use a laser to etch the second lithographic opening 28 downwards. For example, if the anti-fuse 16 below the second lithographic opening 28 is needed for repairing the circuit, the laser can be applied to program the anti-fuse 16 by removing the insulating layer 10 below the second lithographic opening 28 and forming an anti-fuse opening 32. As the present invention utilizes the laser to open the anti-fuse opening 32, the anti-fuse opening 32 can be opened at different positions on every chip based on the circuit defects of different chips. In addition, part of the anti-fuse opening 32 is formed by the lithographic process; thus, the energy used for opening the anti-fuse opening 32 by the laser is decreased. In a general anti-fuse programming process, however, the anti-fuse openings on every chip are usually opened by the same photo mask. Therefore, every chip will have anti-fuse openings at identical positions. In this case, anti-fuse openings which are not needed will be filled up by an insulator.

In the second preferred embodiment of the present invention, the anti-fuse opening 32 is formed entirely by the laser. Similar to the first embodiment, the method of the second embodiment also has the advantage of opening the anti-fuse opening 32 at different positions based on the circuit defects of different chips.

In the third preferred embodiment of the present invention, the anti-fuse opening 32 and the conductive pad opening 26 are both formed by a lithographic process. This method is suitable for mass producing chips with standardized code. For example, after all the major circuits are completed, the chip can be customized by conducting or breaking predetermined circuits using the same photo mask.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An anti-fuse programming method comprising:
   providing an insulating layer having an anti-fuse region, and an anti-fuse at least comprising a first conductor and a second conductor embedded within the anti-fuse region;
   etching the insulating layer by a laser to form an anti-fuse opening in the insulating layer and partly exposing the first conductor and the second conductor through the anti-fuse opening; and
   forming an under bump metallurgy layer disposed in the anti-fuse opening to electrically connect the exposed first conductor and the exposed second conductor.

2. The anti-fuse programming method of claim 1, wherein during the laser etching step, the laser only etches the insulating layer, and the anti-fuse opening has a reversed bottle cross-section once the laser etching step is completed.

3. The anti-fuse programming method of claim 1, wherein during the laser etching step, the laser also partly etches the first conductor and the second conductor to make the laser opening have a rectangular cross-section.

4. The anti-fuse programming method of claim 1, wherein the under bump metallurgy layer is disposed only at a bottom of the anti-fuse opening and the under bump metallurgy layer has a straight-lined cross-section.

5. The anti-fuse programming method of claim 1, wherein the under bump metallurgy layer is disposed at a bottom and a sidewall of the anti-fuse opening and the under bump metallurgy layer has a U-shaped cross-section.

6. The anti-fuse programming method of claim 1, wherein the insulating layer further comprises a circuit region separated from the anti-fuse region, a pad electrically connected to a set of interlayer connections embedded in the insulating layer within the pad region and before the insulating layer is etched by the laser, the insulating layer within the circuit region is partly removed by a lithographic process to form a conductive pad opening and thereby exposes the pad through the conductive pad opening.

7. The anti-fuse programming method of claim 6, further comprising:
   during the lithographic process, removing the insulating layer above the anti-fuse to a level such that the anti-fuse is still embedded in the insulating layer to thereby form a lithographic opening above the anti-fuse.

8. The anti-fuse programming method of claim 6, wherein when the under bump metallurgy layer is formed in the anti-fuse opening, the under bump metallurgy layer is also formed conformally in the conductive pad opening.

9. The anti-fuse programming method of claim 8, further comprising:
   after the under bump metallurgy layer is formed, forming a conductive layer in the conductive pad opening and the anti-fuse opening.

10. An anti-fuse programming method comprising:
    providing an insulating layer having an anti-fuse region and a circuit region, wherein the circuit region is separated from the anti-fuse region, an anti-fuse at least comprises a first conductor and a second conductor embedded within the anti-fuse region, and a pad electrically connected to a set of interconnects is embedded in the insulating layer within the circuit region;
    partly removing the insulating layer within the circuit region and within the anti-fuse region by a lithographic process to form a conductive pad opening exposing the pad and form a lithographic opening above the anti-fuse;
    etching the insulating layer below the lithographic opening by a laser to form an laser opening extending from the lithographic opening and partly exposing the first conductor and the second conductor through the laser opening, wherein the lithographic opening and the laser opening form an anti-fuse opening; and
    forming an under bump metallurgy layer disposed in the anti-fuse opening and the conductive pad opening, wherein the under bump metallurgy layer in the anti-fuse opening electrically connects the exposed first conductor and the exposed second conductor.

11. The anti-fuse programming method of claim 10, wherein during the laser etching step, the laser only etches the insulating layer to partly expose the first conductor and the second conductor such that the anti-fuse opening has a reversed bottle cross-section after the laser etching step is completed.

12. The anti-fuse programming method of claim 10, wherein during the laser etching step, the laser also partly etches the first conductor and the second conductor such that the anti-fuse opening has a rectangular cross-section.

13. The anti-fuse programming method of claim 10, wherein the under bump metallurgy layer is disposed only at a bottom of the anti-fuse opening and the under bump metallurgy layer forms a straight-lined cross-section.

14. The anti-fuse programming method of claim 10, wherein the under bump metallurgy layer is disposed at a bottom and a sidewall of the anti-fuse opening and the under bump metallurgy layer forms a U-shaped cross-section.

15. The anti-fuse programming method of claim 10, further comprising:
    after the under bump metallurgy layer is formed, forming a third conductive layer in the anti-fuse opening and the conductive pad opening.

16. An anti-fuse structure comprising:
    an anti-fuse comprising at least a first conductor and a second conductor disposed within an insulating layer;
    an anti-fuse opening disposed between the first conductor and the second conductor, wherein a first edge of the first conductor and a second edge of the second conductor are exposed through the anti-fuse opening; and
    an under bump metallurgy layer disposed in the anti-fuse opening to electrically connect the first edge of the first conductor and the second edge of the second conductor, wherein the first conductor and the second conductor only electrically connect to each other through the under bump metallurgy layer.

17. The anti-fuse structure of claim 16, wherein the first conductor and the second conductor are both rectangular metal stripes disposed parallel to each other.

18. The anti-fuse structure of claim 16, wherein the anti-fuse opening has a rectangular cross-section or a reversed bottle cross-section.

19. The anti-fuse structure of claim 16, wherein the under bump metallurgy layer is disposed only at a bottom of the anti-fuse opening and the under bump metallurgy layer forms a straight-lined cross-section.

20. The anti-fuse structure of claim 16, wherein the under bump metallurgy layer is disposed at a bottom and a sidewall of the laser opening and the under bump metallurgy layer forms a U-shaped cross-section.

* * * * *